(12) United States Patent
Park et al.

(10) Patent No.: US 10,916,719 B2
(45) Date of Patent: Feb. 9, 2021

(54) FLEXIBLE DISPLAY

(71) Applicant: LG Display Co., Ltd., Seoul (KR)

(72) Inventors: Jung-Kyu Park, Paju-si (KR); Tae-Woo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/710,617

(22) Filed: Dec. 11, 2019

(65) Prior Publication Data

US 2020/0119293 A1 Apr. 16, 2020

Related U.S. Application Data

(63) Continuation of application No. 16/175,409, filed on Oct. 30, 2018, now Pat. No. 10,541,373.

(30) Foreign Application Priority Data

Oct. 31, 2017 (KR) ........................ 10-2017-0144056

(51) Int. Cl.
| | |
|---|---|
| *G06F 1/16* | (2006.01) |
| *H01L 51/00* | (2006.01) |
| *H05K 5/00* | (2006.01) |
| *H01L 51/52* | (2006.01) |
| *G02F 1/1333* | (2006.01) |
| *G09F 9/30* | (2006.01) |
| *H04M 1/02* | (2006.01) |
| *H01L 27/32* | (2006.01) |

(52) U.S. Cl.
CPC .... *H01L 51/0097* (2013.01); *G02F 1/133305* (2013.01); *G06F 1/1652* (2013.01); *G09F 9/301* (2013.01); *H01L 51/5237* (2013.01); *H04M 1/0268* (2013.01); *H05K 5/0017* (2013.01); *H01L 27/323* (2013.01); *H01L 27/3244* (2013.01); *H01L 2251/5338* (2013.01)

(58) Field of Classification Search
CPC ....................................................... G06F 1/1652
USPC ............................ 361/679.3, 679.55, 679.56
See application file for complete search history.

(56) References Cited

U.S. PATENT DOCUMENTS

| | | | |
|---|---|---|---|
| 9,354,476 B2 | 5/2016 | Han et al. | |
| 9,535,452 B2 | 1/2017 | Ahn | |
| 9,552,018 B2 | 1/2017 | Sato | |
| 10,028,395 B2* | 7/2018 | Chen | G02F 1/133308 |
| 10,088,063 B2 | 10/2018 | Rappoport et al. | |
| 10,143,098 B1 | 11/2018 | Lee | |
| 10,159,160 B2 | 12/2018 | Zhao et al. | |
| 10,180,702 B2 | 1/2019 | Dabov et al. | |
| 10,185,363 B2 | 1/2019 | Hiroki | |
| 10,191,516 B2 | 1/2019 | Jang et al. | |
| 10,203,727 B2 | 2/2019 | Sun | |
| 10,234,905 B2 | 3/2019 | Chen et al. | |
| 2007/0164923 A1* | 7/2007 | Kanai | G06F 1/1683 |
| | | | 345/1.1 |

(Continued)

FOREIGN PATENT DOCUMENTS

| | | |
|---|---|---|
| CN | 203117600 U | 8/2013 |
| CN | 103514812 A | 1/2014 |

(Continued)

*Primary Examiner* — Anthony Q Edwards
(74) *Attorney, Agent, or Firm* — Seed IP Law Group LLP

(57) ABSTRACT

Disclosed is a flexible display that is slim for flexibility, is controlled in stiffness, and has improved reliability owing to a structure of a non-folding portion thereof.

12 Claims, 13 Drawing Sheets

(56) References Cited

U.S. PATENT DOCUMENTS

| | | | |
|---|---|---|---|
| 2014/0126133 A1 | 5/2014 | Griffin et al. | |
| 2015/0261259 A1* | 9/2015 | Endo | G06F 1/1618 361/679.06 |
| 2016/0195901 A1* | 7/2016 | Kauhaniemi | G06F 1/1681 361/679.27 |
| 2016/0216739 A1 | 7/2016 | Choi et al. | |
| 2018/0150112 A1* | 5/2018 | Aoki | H04M 1/0268 |
| 2019/0372033 A1* | 12/2019 | Li | H01L 51/0097 |

FOREIGN PATENT DOCUMENTS

| | | |
|---|---|---|
| CN | 104217647 A | 12/2014 |
| CN | 105842890 A | 8/2016 |
| CN | 106486010 A | 3/2017 |

\* cited by examiner

FLEXIBLE DISPLAY

CROSS-REFERENCE TO RELATED APPLICATION(S)

This application claims the benefit of Korean Patent Application No. 10-2017-0144056 filed on Oct. 31, 2017 and U.S. patent application Ser. No. 16/175,409 filed on Oct. 30, 2018, both of which are hereby incorporated by reference as if fully set forth herein.

BACKGROUND

Technical Field

The present disclosure relates to a flexible display, and more particularly, to a flexible display, which increases the stiffness of a non-folding portion to maintain reliability even during frequent folding operations, and which achieves increased device efficiency with a reduced bezel area.

Description of the Related Art

An image display, which reproduces various pieces of information on a screen, is a core technology of the information and communication age, and is being developed in the direction of becoming thinner, lighter, and having higher performance. Thus, as a flat panel display capable of reducing the disadvantageous weight and volume of a cathode ray tube (CRT), for example, an organic light-emitting display, which enables self-luminescence and obviates a light source unit, is in the spotlight.

In such an organic light-emitting display, a plurality of pixels is arranged in a matrix form to display an image. Here, each pixel includes a light-emitting element and a pixel-driving circuit constituted by a plurality of transistors, which drive the light-emitting element independently of each other.

Recently, with regard to various applications, there is increasing demand for a flexible display, which is easy to carry in a pocket or a small pouch and is capable of displaying an image on a larger screen than when being carried. Such a flexible display is folded or partially bent when it is carried or stored, but is unfolded when displaying an image, which may increase an image display area and may cause an increase in user visual sensation and viewing realism.

A display panel that displays an image may be implemented to have a slim design with a reduced substrate thickness. In addition, a flexible display needs to be fastened into a case structure in order to protect the display panel from moisture or external physical shocks.

Furthermore, in consideration of frequent and repetitive stress situations such as folding, in addition to the case structure, the flexible display may further include a midframe, which is disposed to face the display panel, on which an image is displayed, and which serves to alleviate stress and protect the display panel.

In this case, the display panel and the mid-frame are generally attached to each other by an adhesive layer. Then, the mid-frame may include a plurality of circular loops provided on a side portion thereof so as to be fixed to the case structure using the circular loops, or may be fixed inside the case structure via a separate support member.

However, the circular loops, provided on the side portion of the mid-frame, protrude outwards from the display panel by at least the diameter thereof, which forms a dead area that is not used at all for image display. Therefore, this area needs to be hidden by a bezel including the case structure, which acts as a major cause of reducing device display area efficiency.

BRIEF SUMMARY

Accordingly, the present disclosure is directed to a flexible display that substantially obviates one or more problems due to limitations and disadvantages of the related art.

The present disclosure has been provided to solve the problems described above, and an object of the present disclosure is to provide a flexible display, which increases the stiffness of a non-folding portion to maintain reliability even during frequent folding operations, and which achieves increased device efficiency with a reduced bezel area.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, the present disclosure provides a flexible display, which is slim for flexibility, and is controlled in stiffness, and has improved reliability owing to a structure of a non-folding portion thereof.

According to one embodiment of the present disclosure, a flexible display includes a display panel, a plate comprising a first surface facing a surface of the display panel and a second surface opposite the first surface, the plate being divided into a folding portion and a non-folding portion adjacent to the folding portion, the folding portion having a stiffness less than that of the non-folding portion, and a fastener coupled to the non-folding portion of the plate through at least one hole in the plate, the at least one hole being adjacent to an edge of the non-folding portion of the second surface of the plate.

The fastener may be a metal bolt on the second surface of the plate.

The fastener may be one of a plurality of fasteners arranged on the second surface of the plate along the edge of the non-folding portion adjacent to opposite sides of the folding portion.

The plurality of fasteners may be a plurality of metal bolts.

The fastener may be provided at a corner of the non-folding portion in the second surface of the plate.

The fastener may include a body portion configured to protrude from the second surface of the plate by a first height, and a flange coupled to the body portion and on the second surface of the plate, the flange having a first thickness smaller than the first height.

The at least one hole may be filled with a part of a component of the flange.

The flange may include a protrusion on a surface of the flange and the protrusion is fitted into the at least one hole.

The at least one hole in the plate being adjacent to the edge of the non-folding portion of the second surface of the plate and the fastener may be welded together.

The flexible display may further include a supporter between the fastener and the second surface of the plate.

The supporter may have a stiffness greater than that of the non-folding portion of the plate.

The supporter may be aligned with the fastener, and have a line shape having a width equal to or greater than a diameter of the fastener, and the is located on a respective side of the non-folding portion of the plate.

The supporter may continuously pass through an area where the plurality of fasteners is arranged.

The supporter may include one or more discontinuous portions.

The flexible display may further include a case structure configured to accommodate therein the display panel, the plate, and the fastener, or may further include a case structure configured to accommodate therein the display panel, the plate, the fastener, and the supporter.

The supporter may be a flat portion in contact with the second surface of the plate, and a protruding portion bent from a side of the flat portion, and the non-folding portion of the plate may include a groove that receives the protruding portion.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
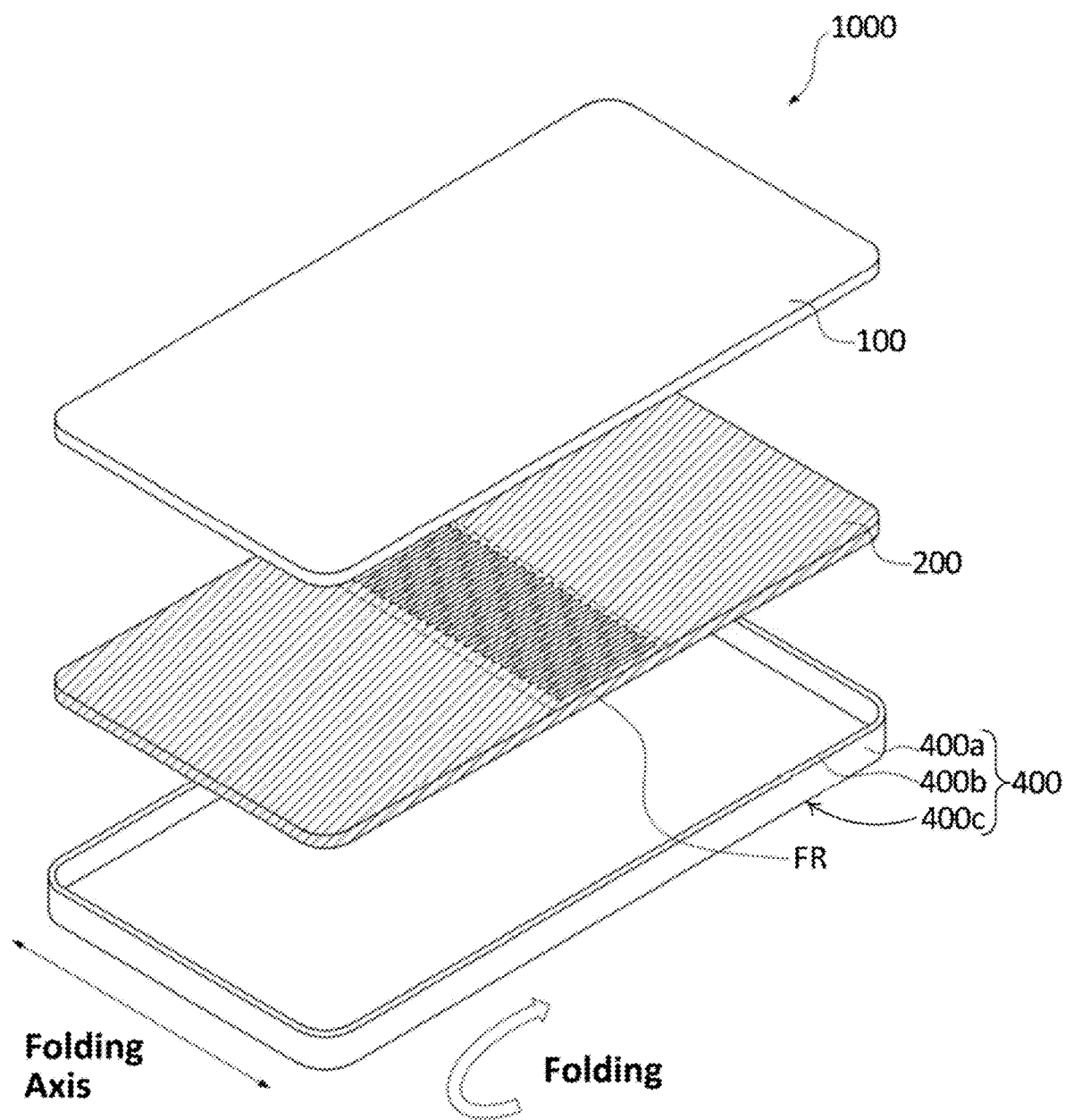
FIG. 1 is a perspective view illustrating a flexible display of the present disclosure.

Hereinafter, exemplary embodiments according to the present disclosure will be described in detail with reference to the accompanying drawings. Wherever possible, the same reference numbers will be used throughout the drawings to refer to the same or like parts. In addition, in the following description of the embodiments, a detailed description of known functions and configurations incorporated herein will be omitted when it may impede the understanding of the embodiments. In addition, the names of constituent elements used in the following description are selected in consideration of ease of writing of the specification, and may differ from names of parts of actual products.

Further, it will be understood that, when an element or a layer is referred to as being "on" another element or layer, it can be directly on the other element or layer or intervening elements or layers may also be present. On the other hand, it will be understood that, when an element or a layer is referred to as being "in contact with" another element, it is directly on the other element without intervening elements or layers therebetween.

In the drawings, the thickness or size of each constituent element is illustrated for clarity and convenience, and the present disclosure is not necessarily limited to the illustrated thickness or size of the constituent element.

Hereinafter, exemplary embodiments of the present disclosure will be described with reference to the drawings.

A display of the embodiments, which will be described below, exemplifies a foldable display, the center of which is foldable, or a bendable display, the edge of which is bendable, but a folding portion may be any region of the display. In a flexible display of the present disclosure, deformation of a plate corresponding to the folding portion may be implemented in a manner such that the deformation position is changeable based on a change in the position of the folding portion of the display. Thus, the flexible display of the present disclosure may be referred to using any of various names, such as "foldable display", "bendable display", or "rollable display", as long as it is flexible.

Figure 2:
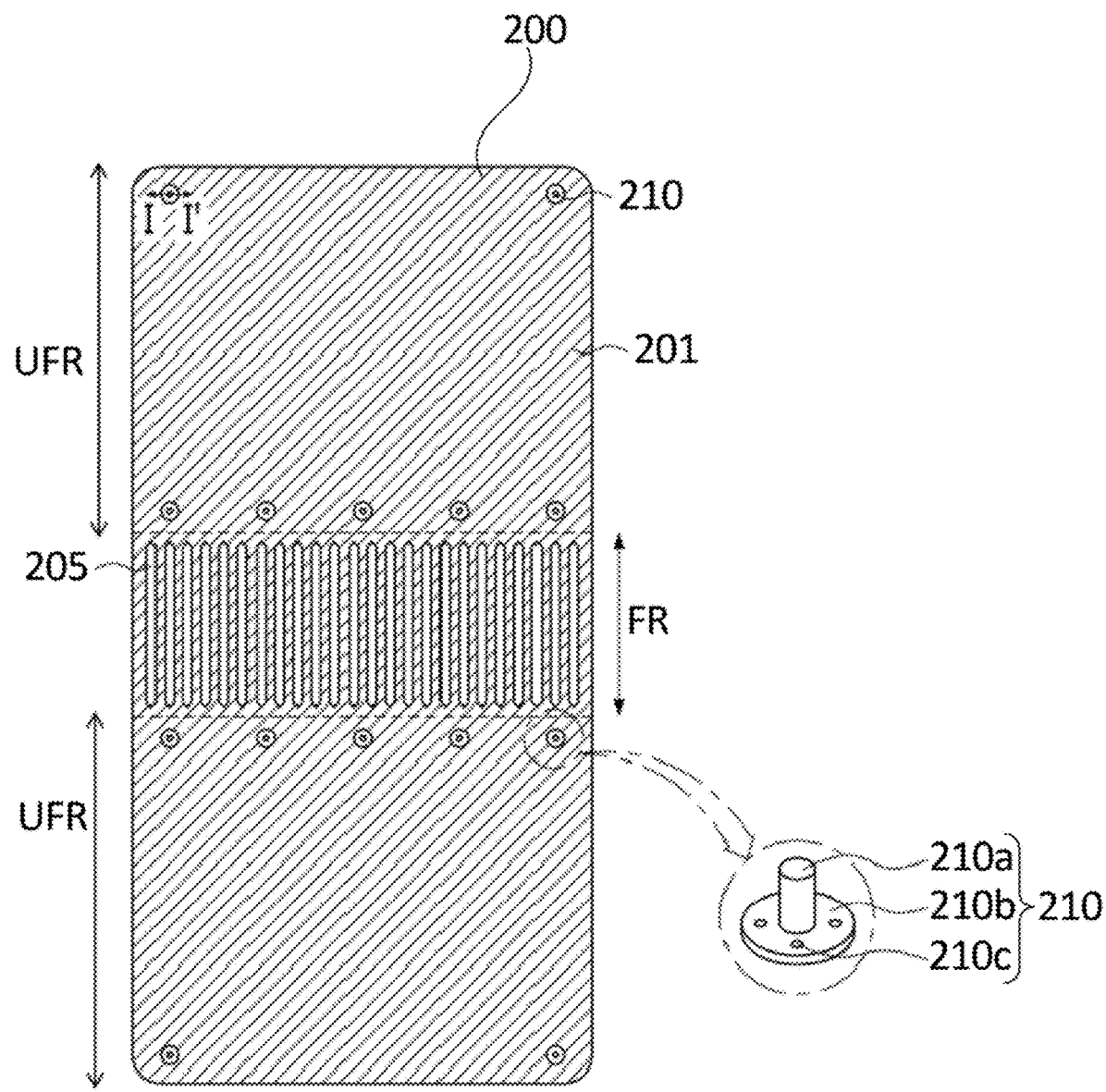
FIG. 2 is a bottom view of a plate illustrated in FIG. 1.
Figure 3:
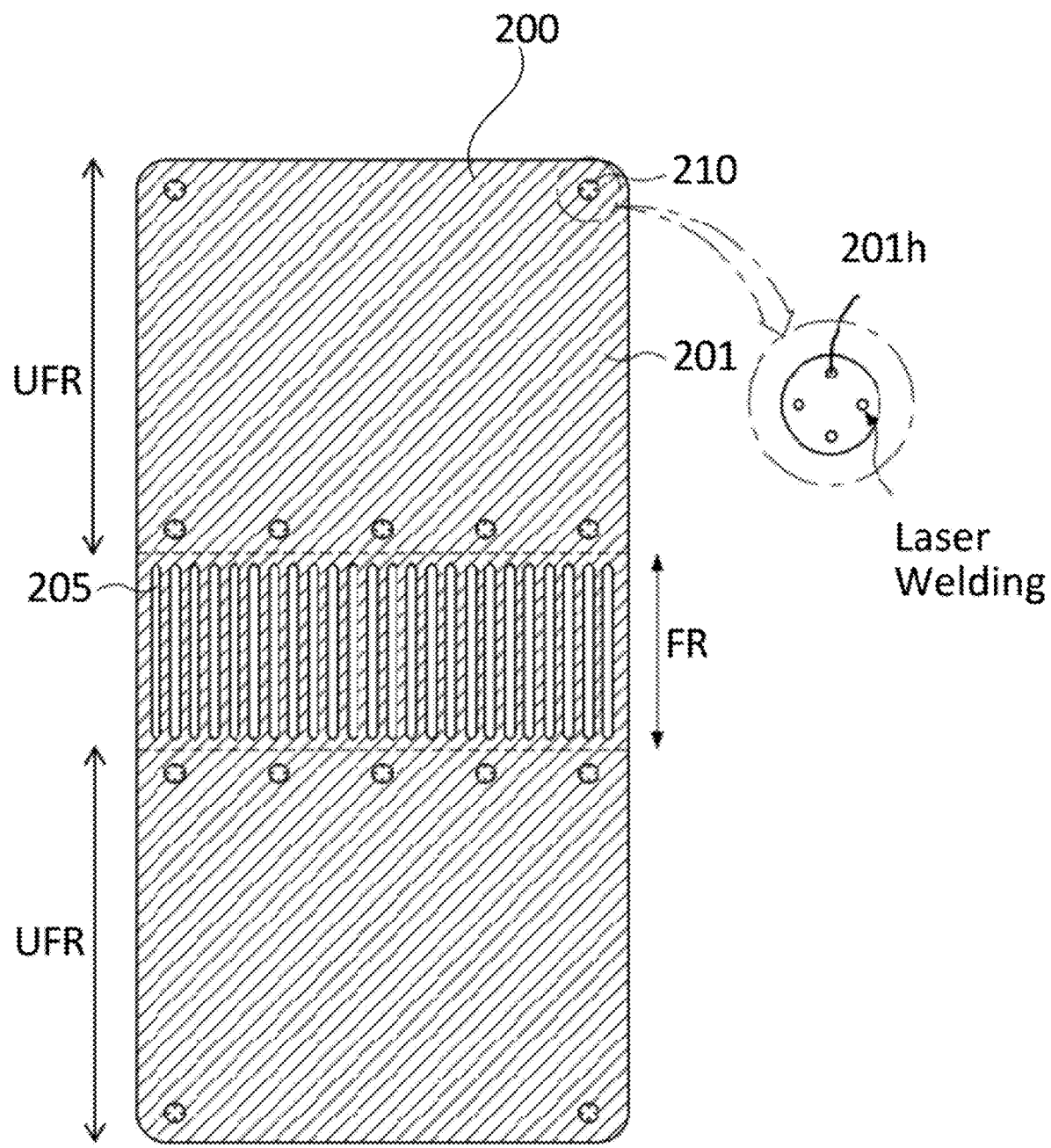
FIG. 3 is a top view of the plate illustrated in FIG. 1.
Figure 4A:
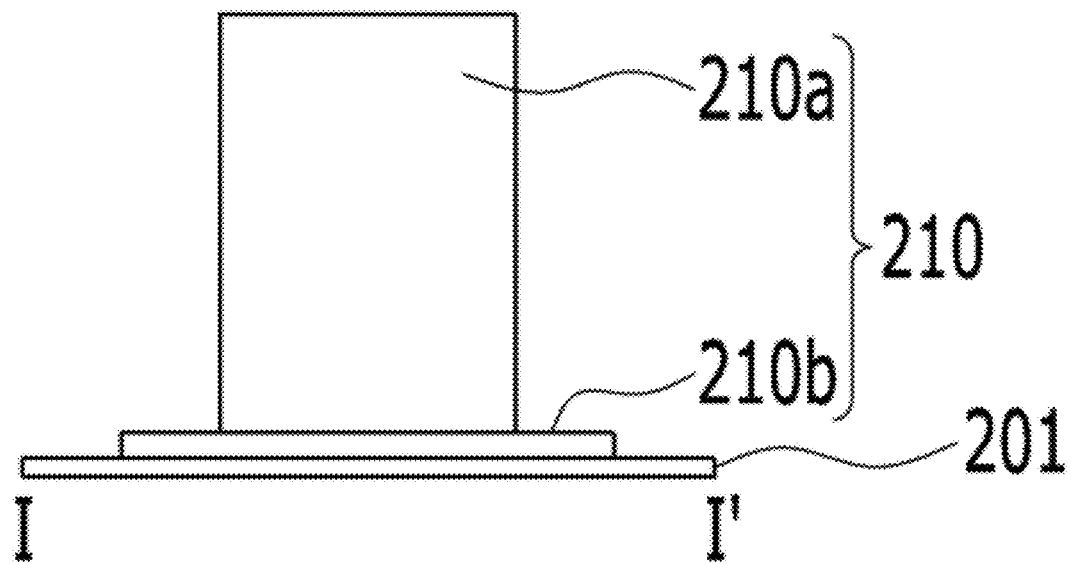
FIG. 4A is a cross-sectional view taken along line I-I' of FIG. 2.
Figure 4B:
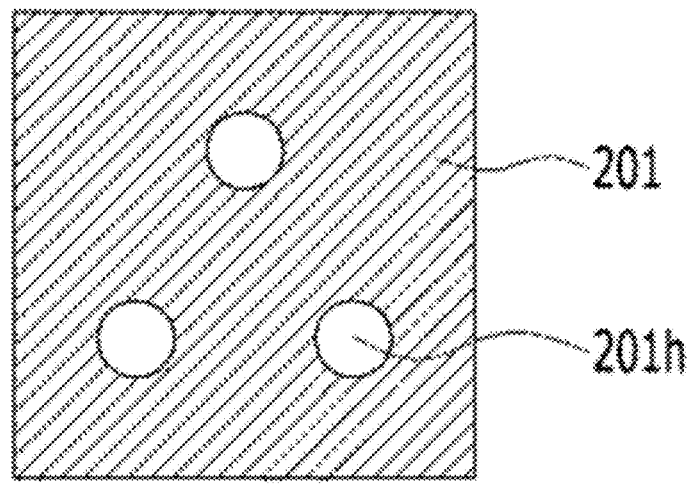
FIG. 4B is a plan view illustrating a region of the plate corresponding to FIG. 4A.
Figure 5:
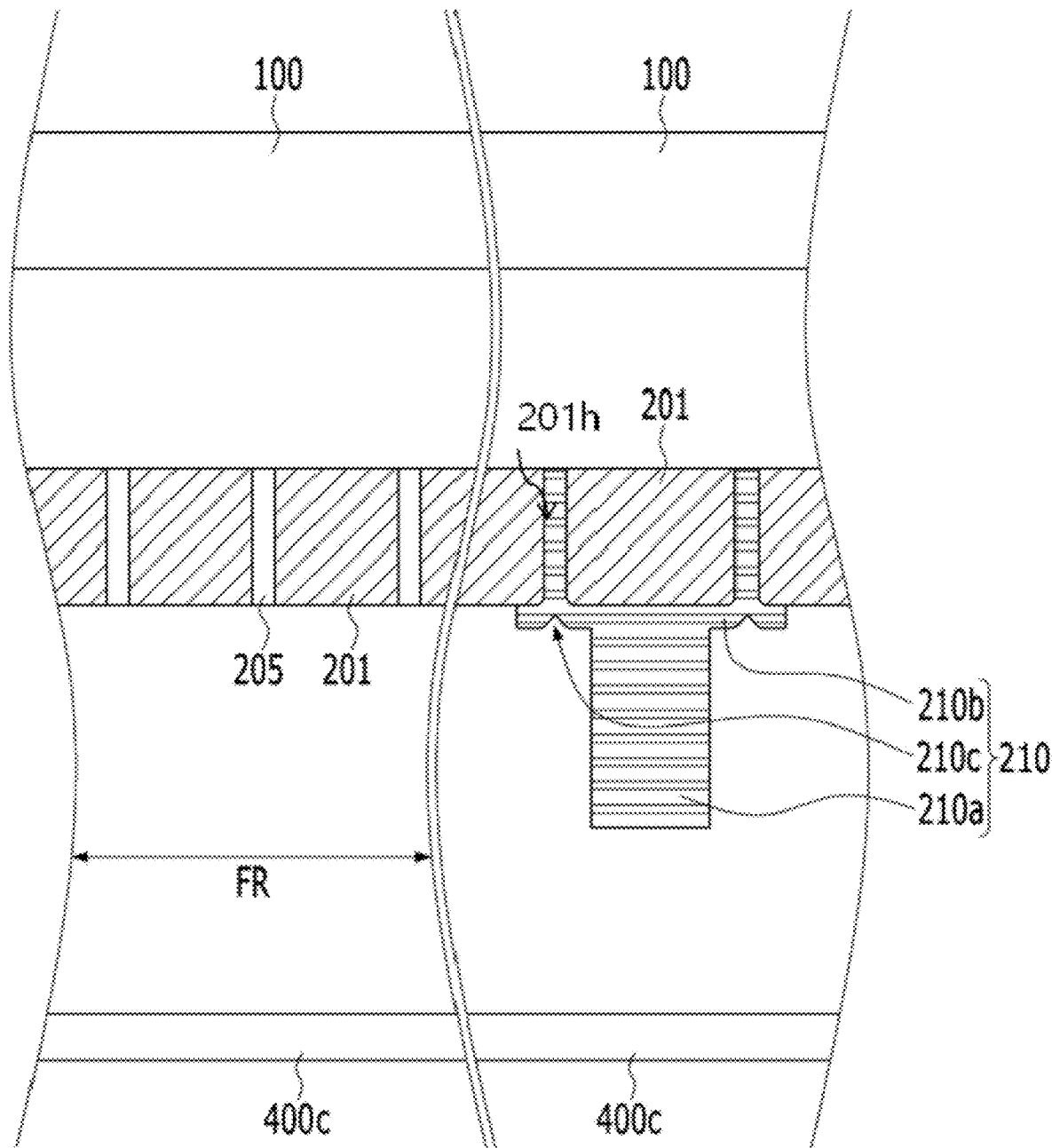
FIG. 5 is a cross-sectional view of a flexible display according to an embodiment of the present disclosure.

FIG. 1 is a perspective view illustrating a flexible display of the present disclosure, FIG. 2 is a bottom view of a plate illustrated in FIG. 1, and FIG. 3 is a top view of the plate illustrated in FIG. 1. In addition, FIG. 4A is a cross-sectional view taken along line I-I' of FIG. 2, and FIG. 4B is a plan view illustrating a region of the plate corresponding to FIG. 4A. FIG. 5 is a cross-sectional view of a flexible display according to an embodiment of the present disclosure.

As illustrated in FIG. 1, the flexible display 1000 of the present disclosure includes a display panel 100, a plate 200, which includes a first surface facing a surface of the display panel 100 and a second surface opposite the first surface, and the plate is divided into at least one folding portion FR with a non-folding portion (see UFR in FIG. 2) adjacent to or around the folding portion FR, the folding portion FR having stiffness lower than that of the non-folding portion UFR, and a fastener 210, which is coupled to the non-folding portion UFR of the lower plate 200 through at least one hole (see 201h in FIG. 4B), which is formed adjacent to the edge of the non-folding portion UFR of the second surface of the plate 200. The fastener 210, which may be referred to herein as a metal bolt 210, may be a connector, a snap fit, a bolt, an interference fit, or any other coupling mechanism or technique. The plate 200, which may be referred to herein as a lower plate 200, may be a plate, a slab, a panel or any other similar such portion or device. The surface of the display panel 100 facing the first surface of the plate, which may be referred to herein as the lower surface of the display panel 100, may be a side, a face, a plane, a second surface or any other similar such portion or device. The first surface of the plate, which may be referred to herein as an upper surface, may be a side, a plane, or some other such portion. The second surface of the plate, which may be referred to herein as a bottom surface, may be a side, a plane, or some other such portion.

The flexible display 1000 includes the display panel 100, the lower plate 200, and a case structure 400 in sequence from the top, as illustrated in FIG. 1. In an illustrated example, the foldable display 1000 of the present disclosure implements a folding operation in a manner such that it is folded in half along a folding axis thereof.

At the time of actual folding, due to the volumes of the display panel 100, the lower plate 200, and the case structure 400 and the curvatures thereof upon folding, the flexible display 1000 is folded to have a "C-"-shaped curved form in the folding portion FR having a predetermined area, rather than being completely folded in half.

Here, a first surface of the display panel 100 of FIG. 1, which may be referred to herein as an upper surface, serves as an exposed surface, which is exposed to the outside and is a display surface. A first surface 400c, which may be referred to herein as a bottom surface, and a second surface 400a, which may be referred to herein as a side surface, of the case structure 400 of FIG. 1 are visible from the outside, together with the display surface of the display panel 100. In some cases, the case structure 400 may further include a third surface 400b, which may be referred to herein as an upper surface, that extends from the side surface 400a so as to overlap the upper surface of the display panel 100 over a predetermined width. However, the upper surface 400b may not be necessary, and when the upper surface 400b is omitted, the upper surface of the display panel 100 may be fully visible from the outside.

The flexible display 1000 is illustrated as having a substantially rectangular shape, but this is merely illustrated by way of example, and the disclosure is not limited thereto. The flexible display 1000 may be changed to have four rounded corners, or may be changed to have a polygonal shape or a circular shape, other than the rectangular shape. Based thereon, the shapes of the display panel 100, the lower plate 200, and the case structure 400 may be changed depending on a change in the shape of the flexible display. The display panel 100, the lower plate 200, and the bottom surface 400c of the case structure 400 may have substantially the same size.

Here, the folding portion FR and the non-folding portion UFR refer to a region that undergoes folding and a region that does not undergo folding, as the names thereof suggest. In the flexible display 1000 of the present disclosure, the shapes of the lower plate 200 and the case structure 400 may be changed depending on the distinction between the folding portion FR and the non-folding portion UFR. An illustrated example exemplifies a foldable display in which the folding portion FR is defined in a central region of the display panel 100 and the lower plate 200.

The display panel 100 is a panel that independently implements display. In order to maintain flexibility of the flexible display, a flexible base material (see 112 in FIG. 14), on which an array including thin-film transistors and the like (see 1100 in FIG. 14) is disposed, may be formed of a flexible plastic film or organic substrate. The flexible base material 112 has an approximate thickness ranging from 3 μm to 100 μm, and the overall approximate thickness of the display panel 100 ranges from 5 μm to 300 μm even when it includes the array formed on the flexible base material 112, so that the display panel 100 may be folded by folding or bending any region thereof. However, in the flexible display as a finished product, the folding portion FR may be set to a specific region, depending on the device requirements. Thus, the folding portion FR may be specified as having different configurations for each region depending on the requirements of other constituent elements excluding the display panel 100. In some cases, in order to secure sufficient flexibility during a folding operation and to prevent damage to the array, the display panel 100 may include the flexible base material 112, which includes different array shapes or different surface structures in the folding portion FR and the non-folding portion UFR.

The lower plate 200 is divided into the folding portion FR and the non-folding portion UFR, and is configured with a steel use stainless (SUS) plate, one surface of which faces the lower surface of the display panel 100. That is, the facing surfaces of the display panel 100 and the lower plate 200 are aligned with each other, so that the display panel 100 and the lower plate 200 integrally operate during folding and unfolding operations. An adhesive layer may be provided between the display panel 100 and the lower plate 200. Alternatively, the adhesive layer may be omitted in some cases. In the latter case, the display panel 100 and the lower plate 200 may be in contact with each other without a gap therebetween, or an air gap of 10 μm or less may be present between the display panel 100 and the lower plate 200.

The reason why the lower plate 200 is formed of steel use stainless is to secure sufficient stiffness as well as flexibility despite a small thickness. Steel use stainless is a material that has a modulus larger than that of an insulation film (insulation layer) in the array and larger than that of the flexible base material 112 provided in the display panel 100. The modulus is generally considered a measure of strength. The smaller the modulus, the greater the elasticity, and the greater the modulus the smaller the elasticity. Thus, when a material has a small modulus, the material has great ability to maintain the original state thereof. The modulus may be measured numerically using Young's modulus.

Here, the lower plate 200 includes a plurality of openings 205 in the folding portion FR, which reduces the specific gravity (or density) of the folding portion FR compared to the non-folding portion UFR so as to adjust the stiffness of the folding portion FR to a relatively small value. The reason why the openings 205 are provided in the folding portion FR of the lower plate 200 is as follows. Since the folding portion FR is repeatedly stressed during folding, the folding portion FR may take a long time to return to the original state thereof after being folded when it has a mass (or specific gravity) equivalent to that of the unfolding portion UFR. The openings 205 are repeatedly formed alternately with non-open portions so that a region, in which the openings 205 are formed, serves as an elastic spring, which assists the folding portion FR in rapidly returning to the original state thereof after being folded. That is, the folding portion FR of the lower plate 200 according to the present disclosure includes the openings 205 and attains a mass ratio or a specific gravity lower than that of the non-folding portion UFR, in order to easily return to the original state thereof after being folded while maintaining the stiffness thereof. The openings 205 may be formed by removing an amount of material corresponding to the thickness of the folding portion FR of the lower plate 200 or to a part of the thickness of the folding portion FR. The openings 205 may be arranged at the same interval over the entirety of the folding portion FR, or the proportion of the openings 205 may increase or decrease from the center to the edge of the folding portion FR. Then, the opening 205 may be shaped such that the longitudinal direction thereof is the direction crossing the folding axis, as illustrated, or conversely, may be shaped such that the longitudinal direction thereof is the direction of the folding axis.

In any case, the openings 205 are located within the folding portion FR of the lower plate 200, and the entire lower plate 200 takes the form of a unitary plate to correspond to the display panel 100 without being divided by the openings 205.

In some cases, a film may further be provided on the surface of the lower plate 200 so that the film comes into contact with the lower surface of the display panel 100 thereabove. This film may be a metal film, a conductive film, or some other type of film material.

Referring to FIGS. 2 to 5, the flexible display of the present disclosure has a feature in that the metal bolt 210 is fastened to the non-folding portion UFR of the lower plate 200. Here, it is to be noted that the metal bolt 210 is located on the bottom surface of the lower plate 200, which does not face the display panel 100, rather than being located on the side surface. That is, although a description will be made below, with reference to a comparative example, a fastener for another appliance is provided on the side portion of a mid-frame supporting the display panel, which increases a dead area. On the other hand, the present disclosure may advantageously eliminate such a dead area since the metal bolt 210 is located on the bottom surface of the lower plate 200.

In addition, the metal bolt 210 includes a body portion 210a, which protrudes from the second surface, which is the bottom surface that does not face the display panel, of the lower plate 200 by a first height, and a flange 210b, which is disposed on the second surface of the lower plate 200 around the body portion 210a and has a first thickness smaller than the first height. Here, the flange 210b has a thickness equal to or less than the thickness of the lower plate 200, and thus is thin, but the body portion 210a has a thickness equal to or greater than the sum of the thickness of the lower plate 200 and the thickness of the flange 210b, and thus a first height thereof is sufficient to allow the metal bolt 210 to be visible on the bottom surface of the lower plate 200.

The metal bolt 210 is not simply placed on the bottom surface of the lower plate 200. The metal bolt 210 may be fitted into the lower plate 200 via a lower protrusion thereof. Alternatively, upon laser welding, a hole 210c may be formed in the flange 210b by radiation of a laser to a portion of the flange 210b, and correspondingly, a hole may also be formed in the lower plate 200 below the hole 210c formed in the flange 210b, so that coupling between the metal bolt 210 and the lower plate 200 is implemented when the holes are filled with a component of the flange 210b that is melted by laser irradiation.

The metal bolt 210, which is applied to the non-folding portion UFR of the lower plate 200 of the flexible display according to the present disclosure, is disposed along the edge of the non-folding portion UFR, more particularly, at the four corners thereof. This is because the lower plate 200, which is integrally attached to the display panel 100 of the flexible display, tends to curl up from the end thereof, the metal bolt 210 serves to increase the stiffness of the corresponding region.

As illustrated in FIGS. 2 and 3, a plurality of metal bolts 210 may be provided on the second surface of the lower plate 200 (the bottom surface that does not face the display panel) so as to be equidistantly disposed along the edge of two non-folding portions UFR on opposite sides of the folding portion FR. Here, through the provision of the plurality of metal bolts 210, it is possible to increase the stiffness of the boundary between the folding portion FR and the non-folding portion UFR, which is vulnerable to stress.

When laser welding is performed to couple the metal bolt 210 to the lower plate 200, a hole 201h is also visible in a portion of the upper surface of the lower plate 200 (which faces the display panel 100). In some cases, when laser irradiation energy is insufficient, the hole 201h may not be formed to fully penetrate the lower plate 200, and in this case, no hole is observed from the upper surface of the lower plate 200.

Although FIG. 3 illustrates the position of the metal bolt 210 for convenience, the metal bolt 210 is not actually observed from the upper surface of the lower plate 200 (which faces the display panel 100), except for the hole (see 201h in FIG. 4B), which may be formed to penetrate the lower plate 200 by laser irradiation.

Reference numeral "201", not described with reference to FIGS. 2 and 3, denotes a body of the lower plate 200 as the remaining area not having the openings 205, and corresponds to a body component of the lower plate 200, i.e., a steel use stainless material.

The above description of FIGS. 4A and 4B and FIG. 5 exemplifies the embodiment of the present disclosure in which a portion of the flange 210b of the metal bolt 210 is bored by laser irradiation (welding) so that a part of a component of the flange 210b, degenerated via the bored portion, is coupled to the lower plate 200.

The metal bolt 210 described above defines a fastening structure together with the lower plate 200, and the bottom surface 400c of the case structure 400 may be located below the fastening structure. In some cases, the body portion 210a of the metal bolt 210 may come into contact with the bottom surface 400c. Alternatively, when a separate member is further provided between the bottom surface 400c of the case structure 400 and the lower plate 200, the metal bolt 210 may be located on the separate member.

Figure 6:
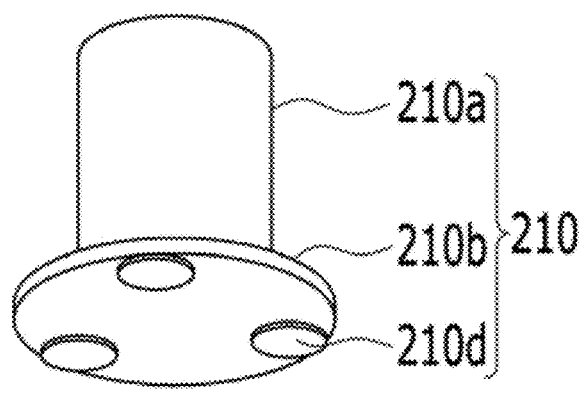
FIG. 6 is a perspective view illustrating the independent shape of a fastener illustrated in FIGS. 2 and 3 according to a modification of the embodiment of the present disclosure.

FIG. 6 is a perspective view illustrating the independent shape of the metal bolt illustrated in FIGS. 2 and 3 according to a modification of the embodiment of the present disclosure.

As illustrated in FIG. 6, in the modification of the embodiment of the present disclosure, a protrusion 210d may be formed in advance on the underside of the flange 210b and a hole 201h, which has a shape corresponding to that of the protrusion 210d, may be formed in a portion of the non-folding portion of the lower plate 200, so that the protrusion 210d is fitted into the hole 201h to realize fastening. When this method is applied, laser irradiation may be omitted, and fastening is possible by mechanical coupling between the metal bolt 210 and the lower plate 200, which may result in increased ease of processing.

Figure 7:
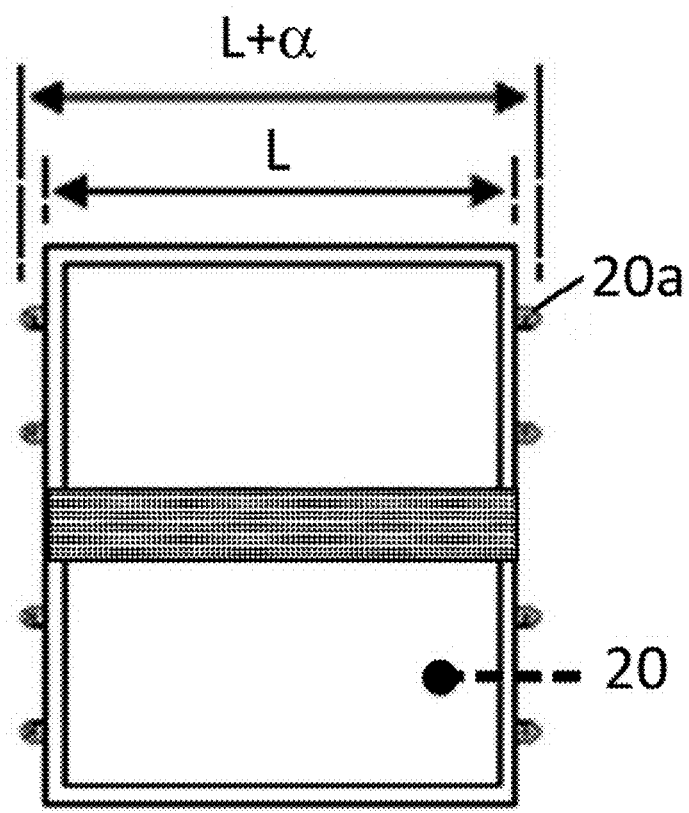
FIG. 7 is a plan view illustrating a plate according to a comparative example.
Figure 8:
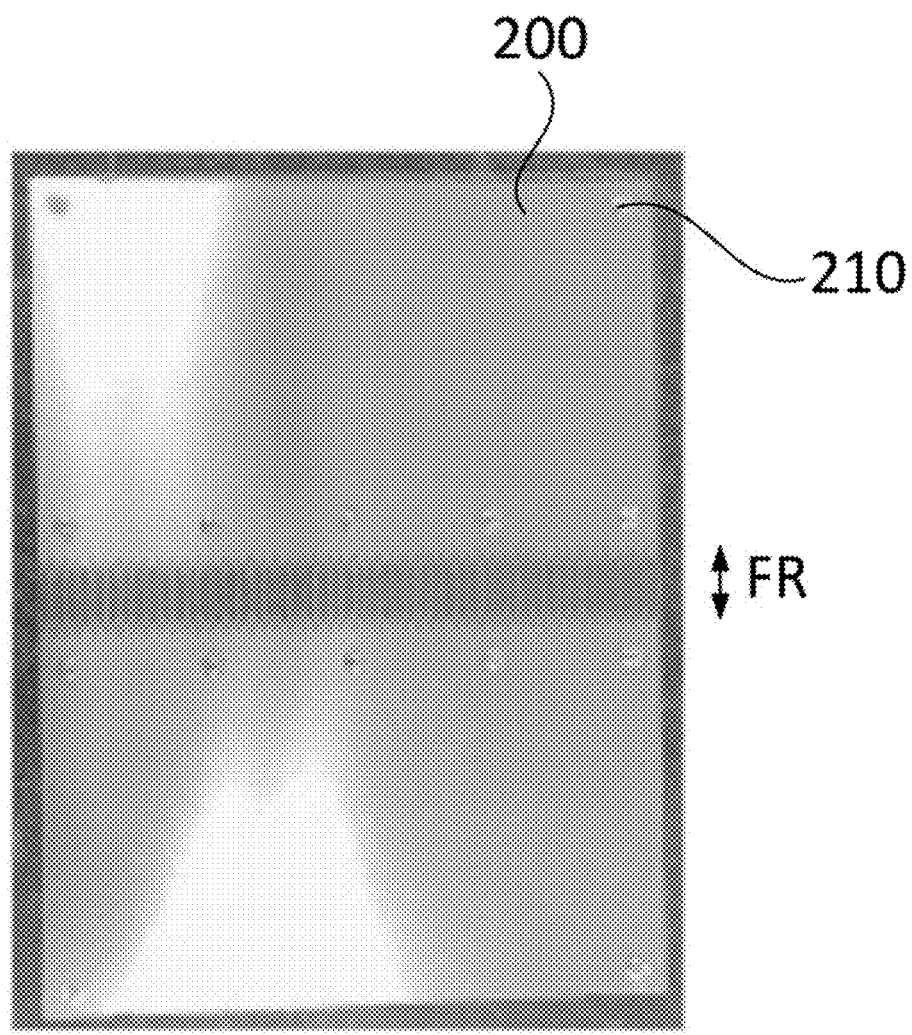
FIG. 8 is a photograph illustrating the bottom surface of a plate, to which the fastener is fastened, according to the embodiment of the present disclosure.

FIG. 7 is a plan view illustrating a plate according to a comparative example, and FIG. 8 is a photograph illustrating the bottom surface of the plate, to which the metal bolt is fastened, according to the embodiment of the present disclosure. The plate may be referred to herein as a lower plate.

As illustrated in FIG. 7, the lower plate 20 according to the comparative example includes fastening loops 20a, having a circular loop shape, on the side portion thereof. In such a case, it is necessary to provide an accommodating case, which accommodates therein members to be coupled to the fastening loops 20a, or a separate coupling and fixing unit.

In this case, in the lower plate 20 of the comparative example, an area excluding the fastening loops 20a that corresponds to the width "L" is used to support the display panel. Due to the fact that the fastening loops 20a are located on opposite sides of the lower plate 20, the accommodating case (or the case structure) requires an area that is equal to or greater than the sum "L+a" of the width α actually occupied by the fastening loops 20 and the transverse width L of the lower plate 20 having a supporting property, which causes an increase in bezel size. The flexible display of the present disclosure may remove at least the area corresponding to the width a from the bezel including the case structure. That is, as illustrated in FIG. 8, by positioning the metal bolt, which is provided to increase stiffness, on the bottom surface of the lower plate, it is possible to prevent the area of the bezel from being increased by the provision of the metal bolt.

Hereinafter, a flexible display according to an alternative embodiment of the present disclosure will be described.

Figure 9:
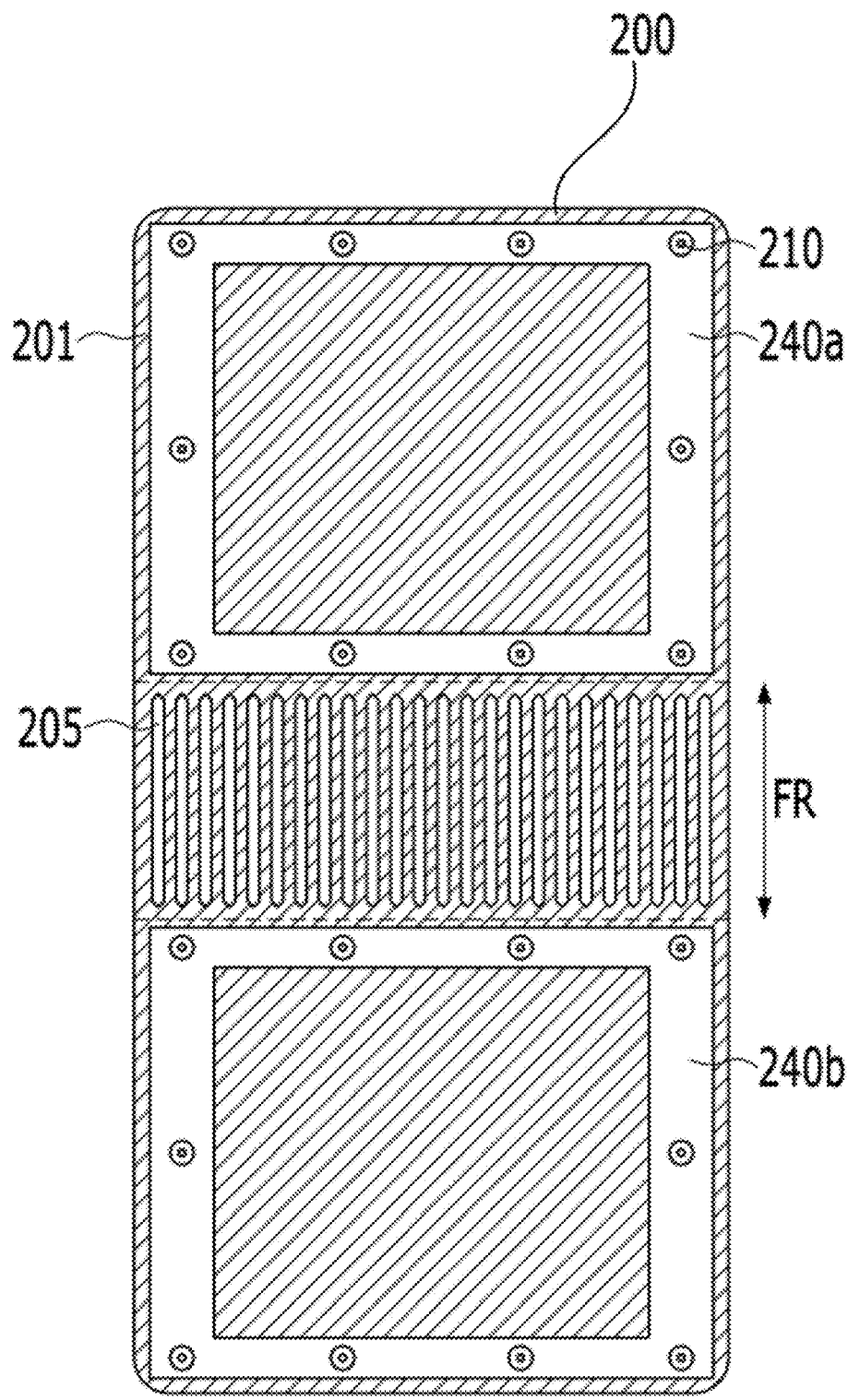
FIG. 9 is a bottom view illustrating the plate of the flexible display according to an alternative embodiment of the present disclosure.
Figure 10:
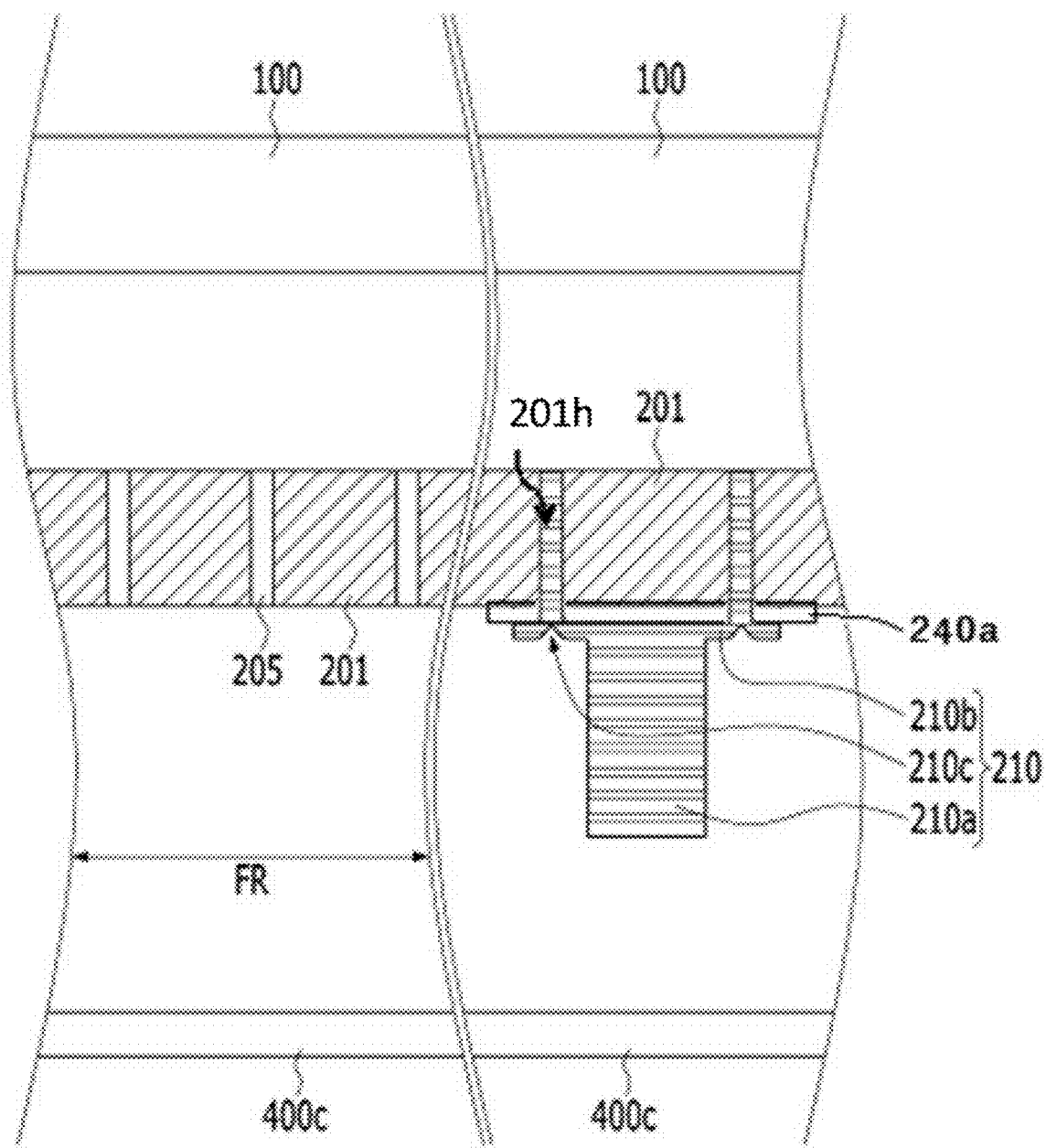
FIG. 10 is a cross-sectional view illustrating the flexible display according to the alternative embodiment of the present disclosure.

FIG. 9 is a bottom view illustrating the lower plate of the flexible display according to an alternative embodiment of the present disclosure, and FIG. 10 is a cross-sectional view illustrating the flexible display according to the alternative embodiment of the present disclosure.

As illustrated in FIGS. 9 and 10, the flexible display according to the alternative embodiment of the present disclosure includes the display panel 100, the lower plate 200, which includes a first surface facing the lower surface of the display panel 100 and a second surface opposite the first surface, and the plane of which is divided into at least one folding portion FR and a non-folding portion UFR around the folding portion FR, the folding portion FR having stiffness lower than that of the non-folding portion UFR, the metal bolt 210, which is coupled to the non-folding portion UFR of the lower plate 200 through at least one hole (see 201h in FIGS. 4B and 10), which is formed in the edge of the non-folding portion UFR of the second surface of the lower plate 200, and supporters 240a and 240b between the metal bolt 210 and the second surface of the lower plate 200.

Here, the supporters 240a and 240b may have stiffness greater than the non-folding portion UFR of the lower plate 200, and may have a continuous and constant line shape so as to increase the supporting force of the non-folding portion UFR of the lower plate 200, in addition to the provision of the metal bolt 210.

The supporters 240a and 240b are disposed over the metal bolts 210 located on respective sides of the non-folding portion UFR of the lower plate 200 so as to have a line shape having a width that is equal to or greater than the diameter of the metal bolt 210. At least the portion in which the metal bolt 210 is located maintains doubled supporting force.

The supporters 240a and 240b are illustrated as having a "☐"-shaped or rectangular shaped or square shaped form with a cut out in FIG. 9, but the disclosure is not limited thereto. However, the supporters 240a and 240b may be formed without a cut out in alternative embodiments. The supporters 240a and 240b may have a "⊏"-shaped form or a C-shaped form, or may be formed such that respective sides thereof have a "-"-shaped or line shaped form and are separately disposed, so as to have discontinuity between adjacent metal bolts 210. In other words, although some embodiments are disclosed, the supporters may be any other shape or form as desired to support the plate 200. When having discontinuity, such discontinuous supporters may be provided respectively on facing sides in order to secure the symmetry of stiffness.

Here, when the supporters 240a and 240b are provided, a portion of the supporters 240a and 240b may be removed. In the structure in which the metal bolt 210 and the lower plate 200 are connected to each other by laser welding (laser irradiation), as illustrated in FIG. 10, a hole may be formed in the supporters 240a and 240b, which are located between the two members, when the hole 210c is formed in the metal bolt 210 by laser irradiation. The hole in the supporters 240a and 240b, and the hole 201h in the non-folding portion UFR of the lower plate 200 may be filled with a part of a component of the metal bolt 210, which is degenerated by laser irradiation.

The metal bolt 210 and the supporters 240a and 240b define a fastening structure with the lower plate 200, and the bottom surface 400c of the case structure 400 may be located below the fastening structure. In some cases, the body portion 210a of the metal bolt 210 may come into contact with the bottom surface 400c. Alternatively, when a separate member is further provided between the bottom surface 400c of the case structure 400 and the lower plate 200, the metal bolt 210 and the supporters 240a and 240b may be located on the separate member.

Figure 11:
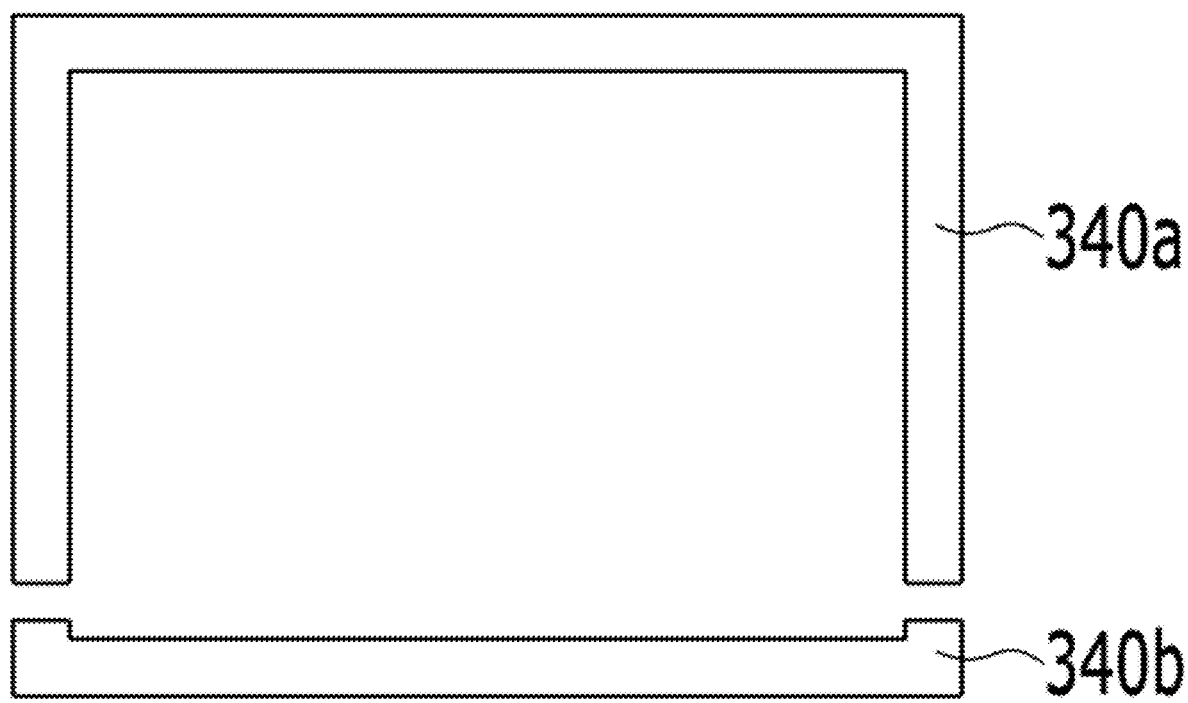
FIG. 11 is a plan view illustrating the shape of a supporter according to a modification of the alternative embodiment of the present disclosure.

FIG. 11 is a plan view illustrating the shape of a supporter according to a modification of the alternative embodiment of the present disclosure.

As illustrated in FIG. 11, supporters 340a and 340b according to the modification of the alternative embodiment of the present disclosure may correspond to one non-folding portion UFR, and may include a first pattern 340a having a "⊏"-shaped form and a second pattern 340b having a "-"-shaped form, which are separate from each other. In this case, the second pattern 340b may be disposed along the folding axis on the edge of the non-folding portion UFR that is adjacent to the folding portion FR, and the first pattern 340a may be located on the remaining region.

Figure 12A:
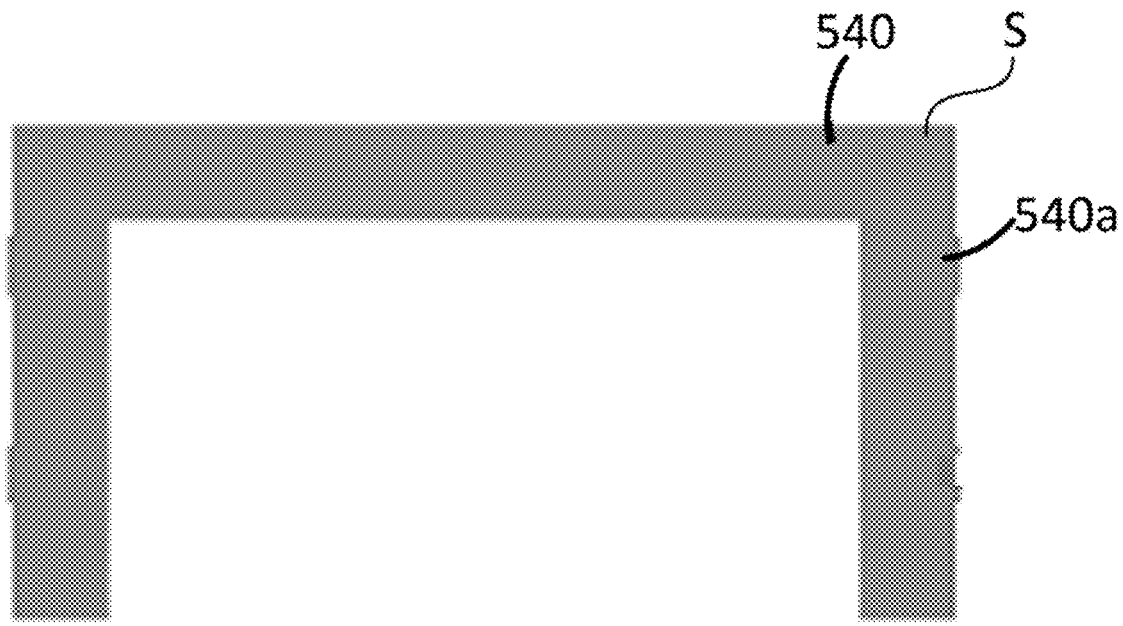
FIGS. 12A and 12B are plan views illustrating a supporter and a non-folding portion of a plate corresponding thereto according to another modification of the alternative embodiment of the present disclosure.
Figure 12B:
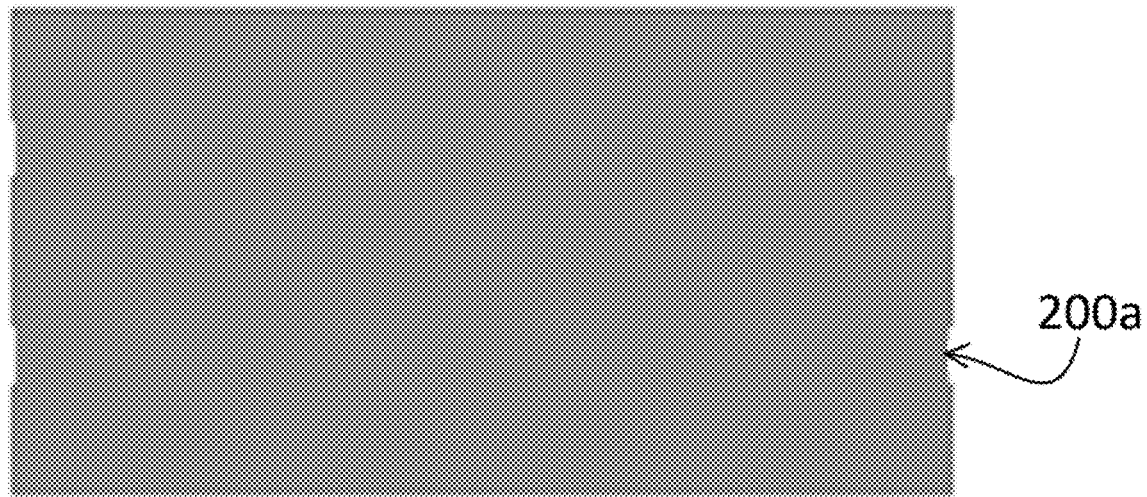

FIGS. 12A and 12B are plan views illustrating a supporter and the non-folding portion of the plate corresponding thereto according to another modification of the alternative embodiment of the present disclosure.

The supporter S according to the other modification of the alternative embodiment of the present disclosure, as illustrated in FIG. 12A, includes a flat portion 540, which is in contact with the bottom surface of the lower plate 200, and a protruding portion 540a, which is bent at 90 degrees from each side of the flat portion 540.

In this case, a groove 200a, which has a shape corresponding to that of the protruding portion 540a, may be formed in the non-folding portion UFR of the lower plate 200 so that the protruding portion 540a is inserted into the groove 200a. In this case, coupling force between the supporter S and the lower plate 200 may be further increased.

Figure 13:
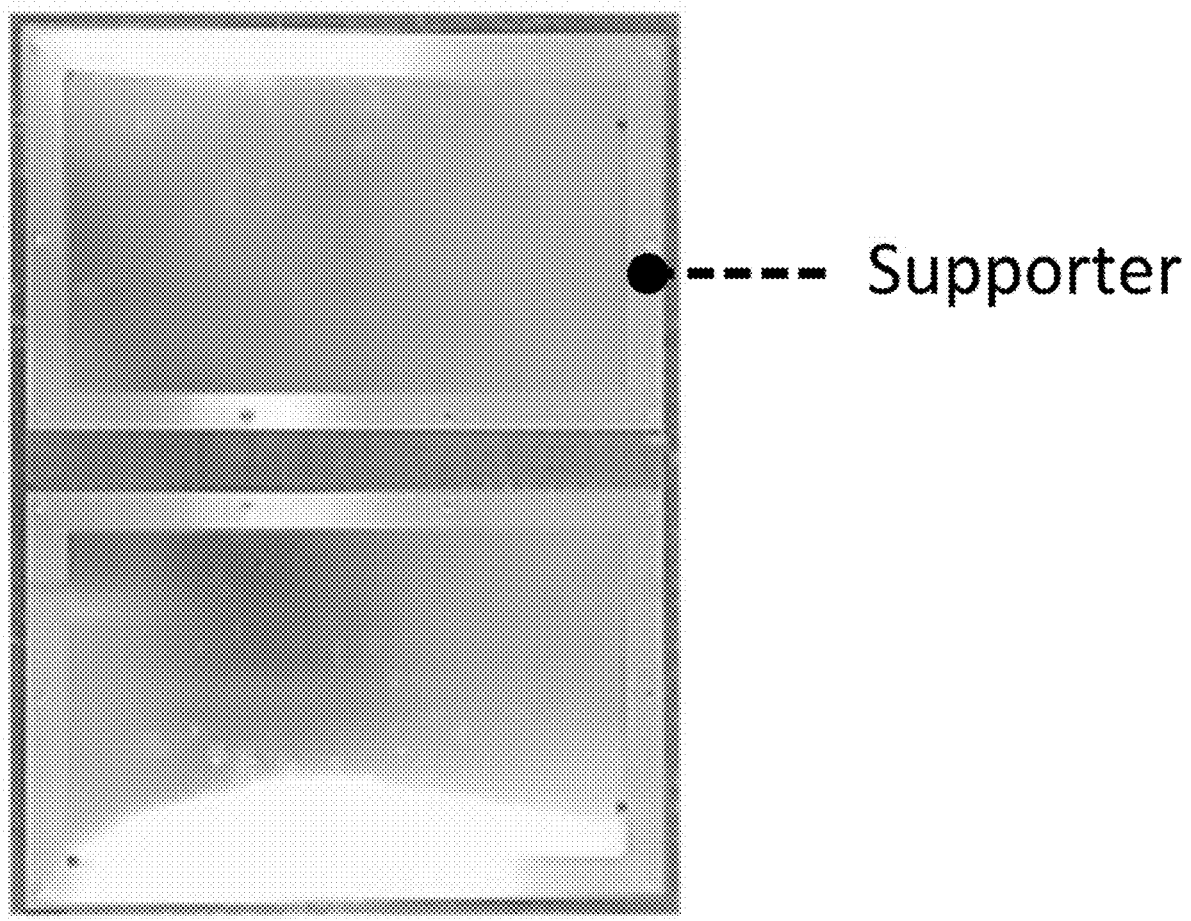
FIG. 13 is a photograph illustrating the bottom surface of a plate, to which the supporter and the fastener are coupled, according to the alternative embodiment of the present disclosure.

FIG. 13 is a photograph illustrating the bottom surface of the lower plate, to which the supporter and the metal bolt are coupled, according to the alternative embodiment of the present disclosure.

As illustrated in FIG. 13, the flexible display according to the alternative embodiment of the present disclosure, to which the supporter as well as the metal bolt are applied, may further increase the stiffness of the non-folding portion of the lower plate without increasing the area of the bezel.

Hereinafter, an example of the display panel 100 located on the lower plate 200 will be described.

Figure 14:
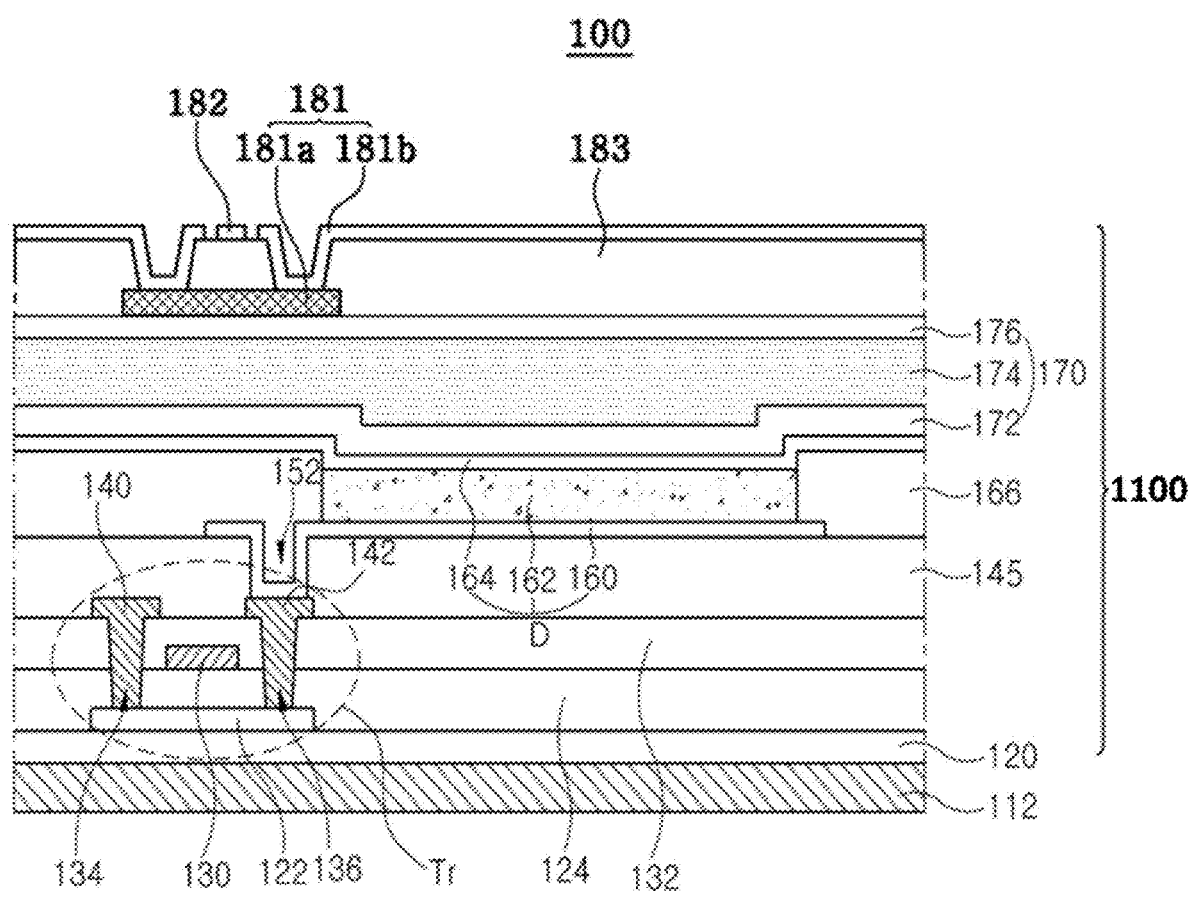
FIG. 14 is a cross-sectional view illustrating a display panel of a flexible display according to the present disclosure.

FIG. 14 is a cross-sectional view illustrating the display panel of the flexible display according to the present disclosure.

As illustrated in FIG. 14, a buffer layer 120 is formed on a flexible substrate or a flexible base material 112, and a thin-film transistor Tr is formed on the buffer layer 120. The buffer layer 120 may be omitted.

A semiconductor layer 122 is formed on the buffer layer 120. The semiconductor layer 122 may be formed of an oxide semiconductor material or polycrystalline silicon.

When the semiconductor layer 122 is formed of an oxide semiconductor material, a light-blocking pattern (not illustrated) may be formed below the semiconductor layer 122. The light-blocking pattern prevents light from being incident on the semiconductor layer 122, thereby preventing the semiconductor layer 122 from being deteriorated by light. Unlike this, the semiconductor layer 122 may be formed of polycrystalline silicon, in which case opposite edges of the semiconductor layer 122 may be doped with a dopant.

A gate insulation layer 124 is formed on the semiconductor layer 122 using an insulating material. The gate insulation layer 124 may be formed of an inorganic insulating material such as silicon oxide or silicon nitride.

A gate electrode 130 is formed on the gate insulation layer 124 using a conductive material such as a metal so as to correspond to the center of the semiconductor layer 122.

Although the gate insulation layer 124 is illustrated as being formed over the entire surface of the flexible base material 112 in FIG. 14, the gate insulation layer 124 may alternatively be patterned to have the same shape as the gate electrode 130.

An interlayer insulation film 132 is formed on the gate electrode 130 using an insulating material. The interlayer insulation film 132 may be formed of an inorganic insulating material such as silicon oxide or silicon nitride, or may be formed of an organic insulating material such as benzocyclobutene or photo-acryl.

The interlayer insulation film 132 has therein first and second contact holes 134 and 136, which expose opposite sides of the semiconductor layer 122. The first and second contact holes 134 and 136 are located at opposite sides of the gate electrode 130 so as to be spaced apart from the gate electrode 130.

Here, the first and second contact holes 134 and 136 are also formed in the gate insulation layer 124. Unlike this, when the gate insulation layer 124 is patterned to have the same shape as the gate electrode 130, the first and second contact holes 134 and 136 may be formed only in the interlayer insulation film 132.

A source electrode 140 and a drain electrode 142 are formed on the interlayer insulation film 132 using a conductive material such as a metal.

The source electrode 140 and the drain electrode 142 are located so as to be spaced apart from the gate electrode 130, and are brought into contact with opposite sides of the semiconductor layer 122 through the first and second contact holes 134 and 136, respectively. Here, the source electrode 140 and the drain electrode 142 may be equidistantly spaced apart from the gate electrode. However, in alternative embodiments the source electrode 140 and the drain electrode 142 may be spaced apart from the gate electrode 130 by different distances or spaces.

The semiconductor layer 122, the gate electrode 130, the source electrode 140, and the drain electrode 142 constitute the thin-film transistor Tr, and the thin-film transistor Tr functions as a driving element.

The thin-film transistor Tr may have a coplanar structure in which the gate electrode 130, the source electrode 142, and the drain electrode 144 are located on the semiconductor layer 122.

Unlike this, the thin-film transistor Tr may have an inverted staggered structure in which the gate electrode is located below the semiconductor layer and the source electrode and the drain electrode are located above the semiconductor layer. In this case, the semiconductor layer may be formed of amorphous silicon.

Although not illustrated, a gate line and a data line cross each other to define a pixel area, and a switching element is further formed so as to be connected to the gate line and the data line. The switching element is connected to the thin-film transistor Tr, which serves as the driving element.

In addition, a power line may be spaced apart from and parallel to the gate line or the data line, and a storage capacitor may further be provided in order to allow a gate electrode of the thin-film transistor Tr, serving as the driving element, to maintain a constant voltage during one frame.

A protective layer 145, which has therein a drain contact hole 152 for exposing the drain electrode 142 of the thin-film transistor Tr, is formed so as to cover the thin-film transistor Tr. Thin-film transistors Tr having the same shape described above are provided in respective pixel areas, and the thin-film transistors Tr provided on the flexible base material 112 are collectively referred to as a thin-film transistor array.

A first electrode 160 is discretely formed on the protective layer 145 for each pixel area so as to be connected to the drain electrode 142 of the thin-film transistor Tr through the drain contact hole 152. The first electrode 160 may be an anode, and may be formed of a conductive material having a relatively large work function value. For example, the first electrode 160 may be formed of a transparent conductive material such as indium-tin-oxide (ITO) or indium-zinc-oxide (IZO), or may be configured with a multilayered electrode including at least one layer of transparent conductive material.

In the case in which the display panel 100 of the present disclosure is of a top-emission type, a reflective electrode or a reflective layer may further be formed below the first electrode 160. For example, the reflective electrode or the reflective layer may be formed of an aluminum-palladium-copper (APC) alloy. In some cases, a transparent conductive material may further be provided below the reflective electrode.

In addition, a bank layer 166 is formed on the protective layer 145 so as to cover the edge of the first electrode 160. The bank layer 166 corresponds to the pixel area and exposes the center of the first electrode 160.

An organic emission layer 162 is formed on the first electrode 160. The organic emission layer 162 may take the form of a single layer formed of a light-emitting material. In addition, in order to increase luminous efficacy, the organic emission layer 162 may have a multilayered structure including a hole injection layer, a hole transport layer, a light-emitting material layer, an electron transport layer, and an electron injection layer, which are sequentially stacked on the first electrode 160.

A second electrode 164 is formed on the organic emission layer 162 above the flexible base material 112. The second electrode 164 may be located over the entirety of a display area, and may be a cathode formed of a conductive material having a relatively small work function value. For example, the second electrode 164 may be formed of any one of aluminum (Al), magnesium (Mg), and an aluminum-magnesium alloy (AlMg).

The first electrode 160, the organic emission layer 162, and the second electrode 164 constitute an organic light-emitting diode D. The organic light-emitting diode D is provided in each pixel area so as to be connected to the thin-film transistor Tr, and organic light-emitting diodes formed in all of the pixel areas are also collectively referred to as an organic light-emitting diode.

An encapsulation film 170 is formed on the second electrode 164 in order to prevent external moisture from entering the organic light-emitting diode D. The encapsulation film 170 may take the form of a stack including a first inorganic insulation layer 172, an organic insulation layer 174, and a second inorganic insulation layer 176, but is not limited thereto as long as it is formed by alternately stacking an inorganic insulation layer and an organic insulation layer so that the outermost layer is an inorganic insulation layer.

In addition, a touch electrode array including a first touch electrode 181 and a second touch electrode 182 may further be provided on the encapsulation film 170 in order to detect a touch. In the illustrated form, a bridge line 181a is provided on the second inorganic insulation layer 176, which is the outermost layer, a touch insulation layer 183 is provided on the bridge line 181a, and a first touch pattern 181b and the second touch electrode 182 are spaced apart from each other on the touch insulation layer 183. Here, the first touch pattern 181b is electrically connected to the bridge line 181a through a contact hole in the touch insulation layer 183 so as to configure the first touch electrode 181. In the drawing, only a portion of the second touch electrode 182 is illustrated. The second touch electrode 182 is located on a portion of the touch insulation layer 183 in which the first touch pattern 181b is not located, and generates mutual capacitance Cm between the first touch pattern 181b and the second touch electrode 182 that are spaced apart from each other.

The presence or absence of a touch may be detected based on variation in mutual capacitance Cm.

The illustrated touch electrode array is given by way of example, and the disclosure is not limited thereto. Although the touch electrode array may be directly formed on the encapsulation film 170, as illustrated, a separate material or insulation layer may further be provided so that the touch electrode array is disposed thereon, or the touch electrode array may be provided inside a cover film. In some cases, the encapsulation film 170 may be located on the top of the display panel 100 without providing the touch electrode array.

A polarizer (not illustrated) may be attached on the touch electrode array in order to reduce the reflection of external light. For example, the polarizer may be a circular polarizer. Alternatively, a cover layer such as a cover window may further be provided in order to protect the top of the touch electrode array.

Reference numeral "1100", not described above, denotes an array structure including all of an array of the thin-film transistors Tr formed on the flexible base material 112, an array of the organic light-emitting diodes D connected to the respective thin-film transistors Tr, the encapsulation film 170 covering the aforementioned constituents, and a touch electrode array 181, 182 and 183.

The display panel described above is given by way of example, and is an organic light-emitting display panel, but may be replaced with any other type of display panel as long as it is flexible. For example, the organic light-emitting display panel described above may be replaced with a flexible liquid-crystal panel, a flexible quantum-dot display panel, or a flexible electrophoretic display panel.

As is apparent from the above description, a flexible display of the present disclosure has the following effects.

First, in the flexible display of the present disclosure, both a display panel and a lower plate supporting the same are flexible, and a metal member is provided in a non-folding portion excluding a folding portion to secure predetermined supporting force. That is, it is possible to prevent folding stress from being transferred to the non-folding portion, thereby improving device reliability.

Second, since the metal member is provided inside the lower plate so as to correspond to the lower plate, with regard to a case structure, which accommodates therein the display panel and the lower plate, the size of the bottom surface thereof may be equal to the size of the display panel. This may minimize a dead area, enabling realization of a structure having a narrow bezel or no bezel.

Third, through the provision of a supporter in addition to the metal member, constant stiffness may be secured and device reliability may be further improved.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Thus, such modifications should be considered to fall within the scope of the present disclosure, and the true technical scope of the present disclosure should be determined by the technical ideas of the claims to be set forth below.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible display comprising:
a display panel;
a plate having a first surface facing a surface of the display panel and a second surface facing away from the surface of the display panel, the plate being divided into at least one folding portion and a non-folding portion adjacent to the folding portion; and
a plurality of first fasteners coupled to the second surface of the plate at a predetermined interval apart from each other along a boundary of the folding portion and the non-folding portion, wherein each of the first fasteners includes a body portion having a first height and a flange coupled to the body portion, the flange having a second height less than the first height.

2. The flexible display according to claim 1, wherein each of the first fasteners is a metal bolt positioned on the second surface of the plate.

3. The flexible display according to claim 1, wherein the body portion and the flange of each fasteners are on the second surface of the plate.

4. The flexible display according to claim 1, wherein a first side of the flange is coupled to the body and a second side of the flange is coupled to the second surface of the plate.

5. The flexible display according to claim 1, wherein the plate has a plurality of openings in the folding portion extending through the first and second surfaces of the plate.

6. The flexible display of claim 5, wherein the plurality of openings extend from a first end of the folding portion to a second end of the folding portion.

7. The flexible display according to claim 1, further comprising:

a supporter having an area that is less than an area of the plate, the supporter fully overlapping the plate.

8. The flexible display according to claim 7, wherein the supporter has a stiffness greater than a stiffness of the plate.

9. The flexible display according to claim 1, further comprising at least one second fastener positioned at a corner of the second surface of the plate, wherein the second fastener is located in the non-folding portion and is not adjacent to the folding portion.

10. The flexible display according to claim 1, wherein the flange is welded and fixed to the second surface of the plate by a continuous hole in the plate and the flange.

11. The flexible display according to claim 1, further comprising:

a case structure to receive the display panel, the plate, and the plurality of first fasteners.

12. The flexible display according to claim 11, wherein the body and the flange of each of first fasteners face an inner surface of the case structure.

* * * * *